(12) United States Patent
Wu et al.

(10) Patent No.: US 11,233,066 B2
(45) Date of Patent: Jan. 25, 2022

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Linchun Wu, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 47 days.

(21) Appl. No.: 16/886,580

(22) Filed: May 28, 2020

(65) Prior Publication Data

US 2021/0335808 A1    Oct. 28, 2021

Related U.S. Application Data

(63) Continuation of application No. PCT/CN2020/087296, filed on Apr. 27, 2020.

(51) Int. Cl.
*H01L 27/115* (2017.01)
*H01L 21/02* (2006.01)
*H01L 27/11582* (2017.01)

(52) U.S. Cl.
CPC .. *H01L 27/11582* (2013.01); *H01L 21/02532* (2013.01); *H01L 21/02576* (2013.01); *H01L 21/02595* (2013.01)

(58) Field of Classification Search
None
See application file for complete search history.

(56) References Cited

U.S. PATENT DOCUMENTS 9,018,047 B2    4/2015   Lue
9,508,730 B2 *  11/2016  Lee ........................ H01L 45/06
(Continued)

FOREIGN PATENT DOCUMENTS

CN    109830529 A    5/2019
CN    109872996 A    6/2019
(Continued)

OTHER PUBLICATIONS

International Search Report issued in corresponding International Application No. PCT/CN2020/087295, dated Jan. 27, 2021, 4 pages.
(Continued)

*Primary Examiner* — Bo B Jang
(74) *Attorney, Agent, or Firm* — Bayes PLLC

(57) ABSTRACT

Embodiments of 3D memory devices and methods for forming the same are disclosed. In an example, a 3D memory device includes an N-type doped region of a substrate, an N-type doped semiconductor layer on the N-type doped region, a memory stack including interleaved conductive layers and dielectric layers on the N-type doped semiconductor layer, a channel structure extending vertically through the memory stack and the N-type doped semiconductor layer into the N-type doped region, and a source contact structure extending vertically through the memory stack and the N-type doped semiconductor layer into the N-type doped region. A first lateral dimension of a first portion of the source contact structure surrounded by the N-type doped region is greater than a second lateral dimension of a second portion of the source contact structure surrounded by the memory stack.

20 Claims, 7 Drawing Sheets

(56) References Cited

U.S. PATENT DOCUMENTS

| | | | |
|---|---|---|---|
| 9,595,535 B1 * | 3/2017 | Ogawa | H01L 27/11582 |
| 9,659,866 B1 * | 5/2017 | Ishigaki | H01L 21/76877 |
| 9,685,452 B2 * | 6/2017 | Lee | H01L 23/535 |
| 10,083,982 B2 | 9/2018 | Shigemura et al. | |
| 10,147,732 B1 | 12/2018 | Hu et al. | |
| 2012/0068255 A1 | 3/2012 | Lee et al. | |
| 2017/0148811 A1 | 5/2017 | Zhang et al. | |
| 2018/0122904 A1 | 5/2018 | Matsumoto et al. | |
| 2018/0182771 A1 | 6/2018 | Costa et al. | |
| 2019/0109150 A1 | 4/2019 | Mori | |
| 2019/0326315 A1 | 10/2019 | Lee et al. | |
| 2019/0333922 A1 | 10/2019 | Jung et al. | |
| 2019/0333931 A1 | 10/2019 | Jung et al. | |
| 2019/0341456 A1 | 11/2019 | Choi et al. | |
| 2019/0355741 A1 | 11/2019 | Lee et al. | |
| 2020/0127008 A1 | 4/2020 | Park et al. | |

FOREIGN PATENT DOCUMENTS

| | | |
|---|---|---|
| CN | 110112134 A | 8/2019 |
| CN | 110391249 A | 10/2019 |
| CN | 110416217 A | 11/2019 |
| CN | 110785851 A | 2/2020 |
| CN | 110998845 A | 4/2020 |
| WO | 2016209615 A1 | 12/2016 |
| WO | 2019027541 A1 | 2/2019 |
| WO | 2020081147 A1 | 4/2020 |

OTHER PUBLICATIONS

International Search Report issued in corresponding International Application No. PCT/CN2020/087296, dated Jan. 21, 2021, 4 pages.

* cited by examiner

THREE-DIMENSIONAL MEMORY DEVICE AND METHOD FOR FORMING THE SAME

CROSS-REFERENCE TO RELATED APPLICATIONS

This application is continuation of International Application No. PCT/CN2020/087296, filed on Apr. 27, 2020, entitled "THREE-DIMENSIONAL MEMORY DEVICE AND METHOD FOR FORMING THE SAME," which is hereby incorporated by reference in its entirety. This application is also related to co-pending U.S. application Ser. No. 16/886,570, filed on even date, entitled "THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes an N-type doped region of a substrate, an N-type doped semiconductor layer on the N-type doped region, a memory stack including interleaved conductive layers and dielectric layers on the N-type doped semiconductor layer, a channel structure extending vertically through the memory stack and the N-type doped semiconductor layer into the N-type doped region, and a source contact structure extending vertically through the memory stack and the N-type doped semiconductor layer into the N-type doped region. A first lateral dimension of a first portion of the source contact structure surrounded by the N-type doped region is greater than a second lateral dimension of a second portion of the source contact structure surrounded by the memory stack.

In another example, a 3D memory device includes an N-type doped region of a substrate, a memory stack including interleaved conductive layers and dielectric layers above the N-type doped region, a single N-type doped semiconductor layer between the N-type doped region and the memory stack and having a uniform doping concentration profile, and a channel structure extending vertically through the memory stack and the N-type doped semiconductor layer into the N-type doped region.

In still another example, a method for forming a 3D memory device is provided. A recess is formed in an N-type doped region of a substrate. A sacrificial layer on the N-type doped region and in the recess, and a dielectric stack on the sacrificial layer are subsequently formed. A channel structure extending vertically through the dielectric stack and the sacrificial layer into the N-type doped region is formed. An opening extending vertically through the dielectric stack into the sacrificial layer in the recess is formed. The sacrificial layer is replaced, through the opening, with an N-type doped semiconductor layer between the N-type doped region and the dielectric stack. A source contact structure is formed in the opening and the recess.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
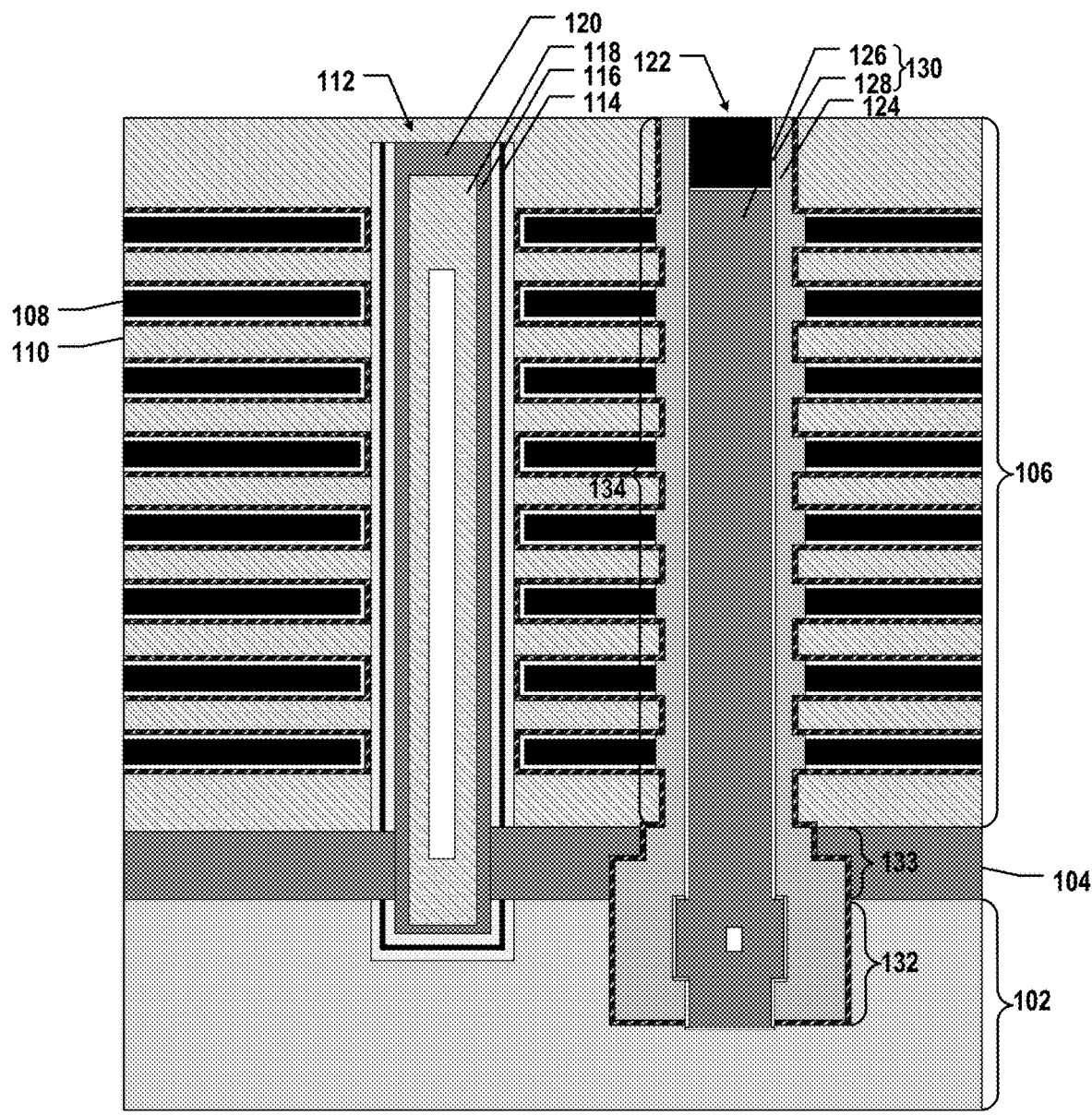
FIG. 1 illustrates a side view of a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture. However, as the thickness and profile of the sidewall SEG depend on the surface condition of the semiconductor channel along the sidewall of the channel structure, the residues on the semiconductor channels may cause large variations in epitaxially growing the sidewall SEG.

Moreover, some 3D NAND memory devices having sidewall SEG perform P-well bulk erase operations with a P-well providing holes for erasing. However, when performing read operations, the P-well needs to be inverted to form an inversion channel, which complicates the control of the source select gate.

Various embodiments in accordance with the present disclosure provide improved 3D memory devices and fabrication methods thereof. An N-type doped semiconductor layer can be deposited to be in contact with the semiconductor channels along the sidewalls of the channel structures, which is not affected by any residues on the semiconductor channels. The N-type doped semiconductor layer in combination with an N-type doped region can generate gate-induced-drain-leakage (GIDL)-assisted body biasing when performing an erase operation (referred to herein as "GIDL erase"), instead of P-well bulk erase, by the 3D memory devices, thereby eliminating the need of inversion channel when performing read operations and simplifying the control of the source select gate. In some embodiments, each opening (e.g., gate line slits (GLSs)) for forming the source contact structure falls into a respective enlarged recess in the N-type doped region to avoid any negative impact due to gouging variations among different openings.

FIG. 1 illustrates a side view of a cross-section of an exemplary 3D memory device 100, according to some embodiments of the present disclosure. 3D memory device 100 can include a substrate, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. The substrate of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device in the y-direction (i.e., the vertical direction) when the substrate is positioned in the lowest plane of the 3D memory device in the y-direction. The same notion for describing the spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate is flipped and faces down toward the peripheral device (not shown) for hybrid bonding, so that in the bonded non-monolithic 3D memory device, the memory array device is above the peripheral device. The memory array device substrate can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

As shown in FIG. 1, the substrate of 3D memory device 100 can include an N-type doped region 102. N-type doped region 102 can be doped with any suitable N-type dopants, such as phosphorus (P), arsenic (Ar), or antimony (Sb), which contribute free electrons and increase the conductivity of the intrinsic semiconductor. In some embodiments, the substrate is an N-type silicon substrate, and N-type doped region 102 is any part of the N-type silicon substrate close to its top surface. In some embodiments, the substrate is a P-type silicon substrate, and N-type doped region 102 is an N-well. For example, part of the P-type silicon substrate may be doped with any suitable N-type dopants, such as P, Ar, or Sb, to form an N-well close to the top surface of the P-type silicon substrate. In some embodiments in which the substrate is a single crystalline silicon, N-type doped region 102 includes single crystalline silicon doped with N-type dopant(s).

As shown in FIG. 1, 3D memory device 100 can also include an N-type doped semiconductor layer 104 on N-type doped region 102. N-type doped semiconductor layer 104 can be an example of the "sidewall SEG" as described above. N-type doped semiconductor layer 104 can include a semiconductor material, such as silicon. In some embodiments, N-type doped semiconductor layer 104 includes polysilicon formed by deposition techniques, as described below in detail. N-type doped semiconductor layer 104 can be doped with any suitable N-type dopants, such as P, Ar, or Sb. For example, N-type doped semiconductor layer 104 may be a polysilicon layer doped with N-type dopant(s), such as P, Ar, or Sb. In some embodiments, N-type doped semiconductor layer 104 is a single polysilicon layer with a uniform doping concentration profile in the vertical direction, as opposed to having multiple polysilicon sub-layers with nonuniform doping concentrations at their interfaces (e.g., a sudden doping concentration change at an interface between two sub-layers). It is understood that the doping concentration of the N-type dopant(s) of N-type doped semiconductor layer 104 may still gradually change in the vertical direction as long as there are not any sudden doping concentration changes that can distinguish two or more sub-layers by doping concentration variations. In some embodiments, the doping concentration of N-type doped semiconductor layer 104 is between about $10^{17}$ cm$^{-3}$ and about $10^{21}$ cm$^{-3}$, such as between $10^{17}$ cm$^{-3}$ and $10^{21}$ cm$^{-3}$ (e.g., $10^{17}$ cm$^{-3}$, $2\times10^{17}$ cm$^{-3}$, $4\times10^{17}$ cm$^{-3}$, $6\times10^{17}$ cm$^{-3}$, $8\times10^{17}$ cm$^{-3}$, $10^{18}$ cm$^{-3}$, $2\times10^{18}$ cm$^{-3}$, $4\times10^{18}$ cm$^{-3}$, $6\times10^{19}$ cm$^{-3}$, $8\times10^{19}$ cm$^{-3}$, $10^{19}$ cm$^{-3}$, $2\times10^{19}$ cm$^{-3}$, $4\times10^{19}$ cm$^{-3}$, $6\times10^{19}$ cm$^{-3}$, $8\times10^{19}$ cm$^{-3}$, $10^{20}$ cm$^{-3}$, $2\times10^{20}$ cm$^{-3}$, $4\times10^{20}$ cm$^{-3}$, $6\times10^{20}$ cm$^{-3}$, $8\times10^{20}$ cm$^{-3}$, $10^{21}$ cm$^{-3}$, any range bounded by the lower end by any of these values, or in any range defined by any two of these values).

In some embodiments, 3D memory device 100 is a NAND Flash memory device in which memory cells are provided in the form of an array of NAND memory strings. Each NAND memory string can include a channel structure 112 that extends through a plurality of pairs each including a conductive layer 108 and a dielectric layer 110 (referred to herein as "conductive/dielectric layer pairs"). The stacked conductive/dielectric layer pairs are also referred to herein as a memory stack 106. The number of the conductive/dielectric layer pairs in memory stack 106 (e.g., 32, 64, 96, 128, 160, 192, 224, 256, etc.) determines the number of memory cells in 3D memory device 100. Although not shown in FIG. 1, it is understood that in some embodiments, memory stack 106 may have a multi-deck architecture, such as a dual-deck architecture that includes a lower memory deck and an upper memory deck on the lower memory deck. The numbers of the pairs of conductive layers 108 and dielectric layers 110 in each memory deck can be the same or different. As shown in FIG. 1, N-type doped semiconductor layer 104 having a uniform doping concentration profile is disposed vertically between N-type doped region 102 and memory stack 106, according to some embodiments. In other words, there is not another N-type doped semiconductor layer, which has a different doping concentration from N-type doped semiconductor layer 104, disposed vertically between N-type doped region 102 and memory stack 106, according to some embodiments.

Memory stack 106 can include a plurality of interleaved conductive layers 108 and dielectric layers 110 on N-type doped semiconductor layer 104. Conductive layers 108 and dielectric layers 110 in memory stack 106 can alternate in the vertical direction. In other words, except the ones at the top or bottom of memory stack 106, each conductive layer 108 can be adjoined by two dielectric layers 110 on both sides, and each dielectric layer 110 can be adjoined by two conductive layers 108 on both sides. Conductive layers 108 can include conductive materials including, but not limited to, W, Co, Cu, Al, polysilicon, doped silicon, silicides, or any combination thereof. Each conductive layer 108 can include a gate electrode (gate line) surrounded by an adhesion layer and a gate dielectric layer. The gate electrode of conductive layer 108 can extend laterally as a word line, ending at one or more staircase structures (not shown) of memory stack 106. Dielectric layers 110 can include dielectric materials including, but not limited to, silicon oxide, silicon nitride, silicon oxynitride, or any combination thereof.

As shown in FIG. 1, channel structure 112 extending vertically through memory stack 106 and N-type doped semiconductor layer 104 into N-type doped region 102. That is, channel structure 112 can include three portions: the lower portion surrounded by N-type doped region 102 (i.e., below the interface between N-type doped semiconductor layer 104 and N-type doped region 102), the upper portion surrounded by memory stack 106 (i.e., above the interface between N-type doped semiconductor layer 104 and memory stack 106), and the middle portion surrounded by N-type doped semiconductor layer 104. As used herein, the "upper portion" of a component (e.g., channel structure 112) is the portion farther away from the substrate in the y-direction, and the "lower portion" of the component (e.g., channel structure 112) is the portion closer to the substrate in the y-direction when the substrate is positioned in the lowest plane of 3D memory device 100.

Channel structure 112 can include a channel hole filled with semiconductor material(s) (e.g., as a semiconductor channel 116) and dielectric material(s) (e.g., as a memory film 114). In some embodiments, semiconductor channel 116 includes silicon, such as amorphous silicon, polysilicon, or single crystalline silicon. In one example, semiconductor channel 116 includes polysilicon. In some embodiments, memory film 114 is a composite layer including a tunneling layer, a storage layer (also known as a "charge trap layer"), and a blocking layer. The remaining space of the channel hole can be partially or fully filled with a capping layer 118 including dielectric materials, such as silicon oxide, and/or an air gap. Channel structure 112 can have a cylinder shape (e.g., a pillar shape). Capping layer 118, semiconductor channel 116, the tunneling layer, the storage layer, and the blocking layer of memory film 114 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, or any combination thereof. The blocking layer can include silicon oxide, silicon oxynitride, high dielectric constant (high-k) dielectrics, or any combination thereof. In one example, memory film 114 can include a composite layer of silicon oxide/silicon oxynitride/silicon oxide (ONO). In some embodiments, channel structure 112 further includes a channel plug 120 at the top of the upper portion of channel structure 112. Channel plug 120 can include semiconductor materials (e.g., polysilicon). In some embodiments, channel plug 120 functions as the drain of the NAND memory string.

As shown in FIG. 1, part of semiconductor channel 116 along the sidewall of channel structure 112 (e.g., in the middle portion of channel structure 112) is in contact with N-type doped semiconductor layer 104, according to some embodiments. That is, memory film 114 is disconnected in the middle portion of channel structure 112 that abuts N-type doped semiconductor layer 104, exposing semiconductor channel 116 to be in contact with the surrounding N-type doped semiconductor layer 104, according to some embodiments. As a result, N-type doped semiconductor layer 104 surrounding and in contact with semiconductor channel 116 can work as the "sidewall SEG" of channel structure 112 to replace the "bottom SEG" as described above, which can mitigate issues such as overlay control, epitaxial layer formation, and SONO punch.

As shown in FIG. 1, 3D memory device 100 can further include a source contact structure 122. Source contact structure 122 can extend vertically through the conductive/dielectric layer pairs in memory stack 106 and N-type doped semiconductor layer 104 into N-type doped region 102. Each source contact structure 122 can be part of an array common source (ACS) of multiple NAND memory strings, for example, electrically connected to multiple channel structures 112. Similar to channel structure 112, source contact structure 122 can also include three portions: a lower portion 132 surrounded by N-type doped region 102, an upper portion 134 surrounded by memory stack 106, and a middle portion 133 surrounded by N-type doped semiconductor layer 104. In some embodiments, a lower lateral dimension (e.g., in the x-direction in FIG. 1) of lower portion 132 is greater than an upper lateral dimension (e.g., in the x-direction in FIG. 1) of upper portion 134 of source contact structure 122, which can facilitate the alignment between upper and lower portions 134 and 132 of source contact structures 122 during the fabrication of 3D memory device 100. That is, lower portion 132 may be viewed as "an enlarged portion" compared with upper portion 134. In some embodiments, the lateral dimension of lower portion 132 of source contact structure 122 surrounded by N-type doped region 102 is greater than the lateral dimension of at least part of middle portion 133 of source contact structure 122 surrounded by N-type doped semiconductor layer 104 due to the process of removing the same material (e.g., polysilicon) of N-type doped semiconductor layer 104 formed on the sidewall of the recess in which source contact structure 122 is formed as described below in detail with respect to the fabrication process. In some embodiments, the lateral dimension of middle portion 133 of source contact structure 122 is greater than the lateral dimension of upper portion 134 of source contact structure 122. It is understood that the lateral dimension of lower portion 132 or upper portion 134 may not uniform in the vertical direction. In one example, the upper and lower lateral dimensions of upper and lower portions 134 and 132 may be measured at the interfaces with the middle portion of source contact structure 122. In another example, the upper lateral dimension of upper portion 134 may be the maximum lateral dimension of upper portion 134 along the vertical direction, and the lower lateral dimension of lower portion 132 may be the minimum lateral dimension of lower portion 132 along the vertical direction, such that any lower lateral dimension of lower portion 132 is greater than any upper lateral dimension of upper portion 134 of source contact structure 122.

Source contact structure 122 can also extend laterally (e.g., in the direction perpendicular to x- and y-directions) to separate memory stack 106 into multiple blocks. Source contact structure 122 can include a spacer 124 and a source contact 130 each extending vertically through memory stack 106 and N-type doped semiconductor layer 104 into N-type doped region 102. That is, both upper and lower portions 134 and 132 of source contact structure 122 include spacer 124 and source contact 130, according to some embodiments. Spacer 124 can include dielectric materials, such as silicon oxide, laterally between source contact 130 and memory stack 106 to electrically insulate source contact 130 from surrounding conductive layers 108 in memory stack 106. As a result, multiple source contact structures 122 can separate 3D memory device 100 into multiple memory blocks and/or memory fingers. On the other hand, spacer 124 can be disposed along the sidewall of source contact structure 122, but not at the bottom of source contact structure 122, such that source contact 130 can be above and in contact with N-type doped region 102 to make an electrical connection with N-type doped region 102.

In some embodiments, source contact 130 includes an adhesion layer 128 and a conductive layer 126 surrounded by adhesion layer 128. Adhesion layer 128 can include one or more conductive materials, such as titanium nitride (TiN), above and in contact with N-type doped region 102 to make an electrical connection with N-type doped region 102. In some embodiments, conductive layer 126 includes polysilicon in its lower portion and a metal (e.g., W) in its upper portion contacting a metal interconnect (not shown). In some embodiments, adhesion layer 128 (e.g., TiN) is in contact with both N-type doped region 102 and the metal (e.g., W) of conductive layer 126 to form an electrical connection between N-type doped region 102 (e.g., as the source of the NAND memory string) and the metal interconnect.

By eliminating a P-well as the source of holes, 3D memory device 100 is configured to generate GIDL-assisted body biasing when performing an erase operation, according to some embodiments. The GIDL around the source select gate of the NAND memory string can generate a hole current into the NAND memory string to raise the body potential for erase operations. Moreover, by eliminating a P-well as the source of holes, the control of the source select gate can be simplified during read operations as well since the inversion channel is no longer needed when performing read operations by 3D memory device 100.

Figure 2A:
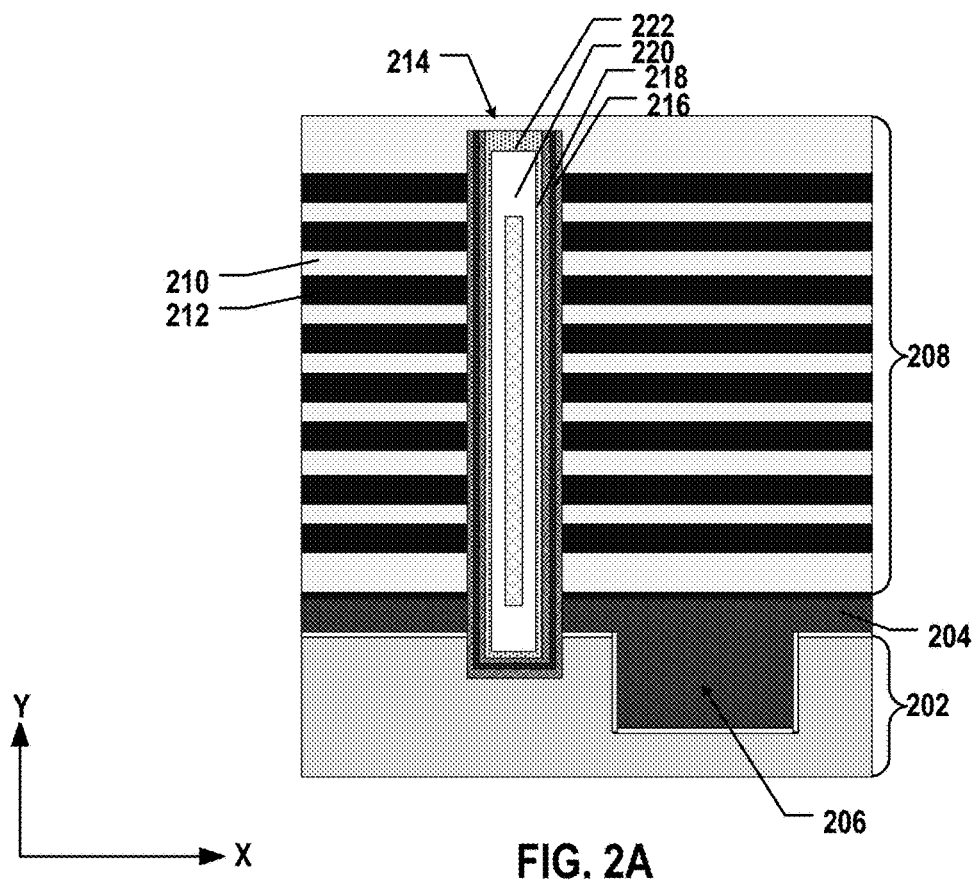
FIGS. 2A-2I illustrate a fabrication process for forming an exemplary 3D memory device, according to some embodiments of the present disclosure.

FIGS. 2A-2I illustrate a fabrication process for forming an exemplary 3D memory device, according to some embodiments of the present disclosure. FIG. 3 illustrates a flowchart of a method 300 for forming an exemplary 3D memory device, according to some embodiments of the present disclosure. Examples of the 3D memory device depicted in FIGS. 2A-2I and 3 include 3D memory device 100 depicted in FIG. 1. FIGS. 2A-2I and 3 will be described together. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a recess is formed in an N-type doped region of a substrate. In some embodiments, the substrate is an N-type silicon substrate. In some embodiments, the substrate is a P-type silicon substrate, and the N-type doped region is an N-well. As illustrated in FIG. 2A, an N-type doped region 202 is formed. In some embodiments, N-type doped region 202 is an N-well formed by doping a portion of a P-type silicon substrate close to its top surface by N-type dopant(s), such as P, Ar, or Sb, using ion implantation and/or thermal diffusion processes. In some embodiments, N-type doped region 202 is a portion of an N-type silicon substrate close to its top surface. A recess 206 can be formed in N-type doped region 202 using dry etch and/or wet etch processes.

Method 300 proceeds to operation 304, as illustrated in FIG. 3, in which a sacrificial layer on the N-type doped region and in the recess, and a dielectric stack on the sacrificial layer are subsequently formed. The sacrificial layer can be a polysilicon layer. The dielectric stack can include a plurality of interleaved stack sacrificial layers and stack dielectric layers.

As illustrated in FIG. 2A, a sacrificial layer 204 is formed on N-type doped region 202 and in recess 206. Sacrificial layer 204 can be formed by depositing polysilicon or any other suitable sacrificial material (e.g., carbon) that can be later selectively removed on N-type doped region 202 as well as into recess 206 using one or more thin film deposition processes including, but not limited to, chemical vapor deposition (CVD), physical vapor deposition (PVD), atomic layer deposition (ALD), or any combination thereof. In some embodiments, a pad oxide layer is formed between sacrificial layer 204 and N-type doped region 202 by depositing dielectric materials, such as silicon oxide, or thermal oxidation, on N-type doped region 202 prior to the formation of sacrificial layer 204.

As illustrated in FIG. 2A, a dielectric stack 208 including a plurality pairs of a first dielectric layer (known as a "stack sacrificial layer 212") and a second dielectric layer (known as a "stack dielectric layer 210") is formed on sacrificial layer 204. Dielectric stack 208 includes interleaved stack sacrificial layers 212 and stack dielectric layers 210, according to some embodiments. Stack dielectric layers 210 and stack sacrificial layers 212 can be alternatively deposited on sacrificial layer 204 to form dielectric stack 208. In some embodiments, each stack dielectric layer 210 includes a layer of silicon oxide, and each stack sacrificial layer 212 includes a layer of silicon nitride. Dielectric stack 208 can be formed by one or more thin film deposition processes including, but not limited to, CVD, PVD, ALD, or any combination thereof.

Method 300 proceeds to operation 306, as illustrated in FIG. 3, in which a channel structure extending vertically through the dielectric stack and the sacrificial layer into the N-type doped region is formed. In some embodiments, to form the channel structure, a channel hole extending vertically through the dielectric stack and the sacrificial layer into the N-type doped region is formed, and a memory film and a semiconductor channel are subsequently formed along a sidewall of the channel hole. In some embodiments, a channel plug is formed above and in contact with the semiconductor channel.

As illustrated in FIG. 2A, a channel hole is an opening extending vertically through dielectric stack 208 and sacrificial layer 204 into N-type doped region 202. In some embodiments, a plurality of openings are formed, such that each opening becomes the location for growing an individual channel structure 214 in the later process. In some embodiments, fabrication processes for forming the channel hole of channel structure 214 include wet etch and/or dry etch processes, such as deep-ion reactive etching (DRIE). In some embodiments, the channel hole of channel structure 214 extends further through the upper portion of N-type doped region 202. The etching process through dielectric stack 208 and sacrificial layer 204 may continue to etch part of N-type doped region 202. In some embodiments, a separate etching process is used to etch part of N-type doped region 202 after etching through dielectric stack 208 and sacrificial layer 204.

As illustrated in FIG. 2A, a memory film 216 (including a blocking layer, a storage layer, and a tunneling layer) and a semiconductor channel 218 are subsequently formed in this order along sidewalls and the bottom surface of the channel hole. In some embodiments, memory film 216 is first deposited along the sidewalls and bottom surface of the channel hole, and semiconductor channel 218 is then deposited over memory film 216. The blocking layer, storage layer, and tunneling layer can be subsequently deposited in this order using one or more thin film deposition processes, such as ALD, CVD, PVD, any other suitable processes, or any combination thereof, to form memory film 216. Semiconductor channel 218 can then be formed by depositing a semiconductor material, such as polysilicon, over the tunneling layer of memory film 216 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are subsequently deposited to form memory film 216 and semiconductor channel 218.

As illustrated in FIG. 2A, a capping layer 220 is formed in the channel hole and over semiconductor channel 218 to completely or partially fill the channel hole (e.g., without or with an air gap). Capping layer 220 can be formed by depositing a dielectric material, such as silicon oxide, using one or more thin film deposition processes, such as ALD, CVD, PVD, any other suitable processes, or any combination thereof. A channel plug 222 then can be formed in the upper portion of the channel hole. In some embodiments, parts of memory film 216, semiconductor channel 218, and capping layer 220 that are on the top surface of dielectric stack 208 are removed and planarized by CMP, wet etch, and/or dry etch processes. A recess then can be formed in the upper portion of the channel hole by wet etching and/or drying etching parts of semiconductor channel 218 and capping layer 220 in the upper portion of the channel hole. Channel plug 222 then can be formed by depositing semiconductor materials, such as polysilicon, into the recess by one or more thin film deposition processes, such as CVD, PVD, ALD, or any combination thereof. Channel structure 214 is thereby formed through dielectric stack 208 and sacrificial layer 204 into N-type doped region 202.

Method 300 proceeds to operation 308, as illustrated in FIG. 3, in which an opening extending vertically through the dielectric stack into the sacrificial layer in the recess is formed. In some embodiments, a lateral dimension of the recess is greater than a lateral dimension of the opening.

Figure 2B:
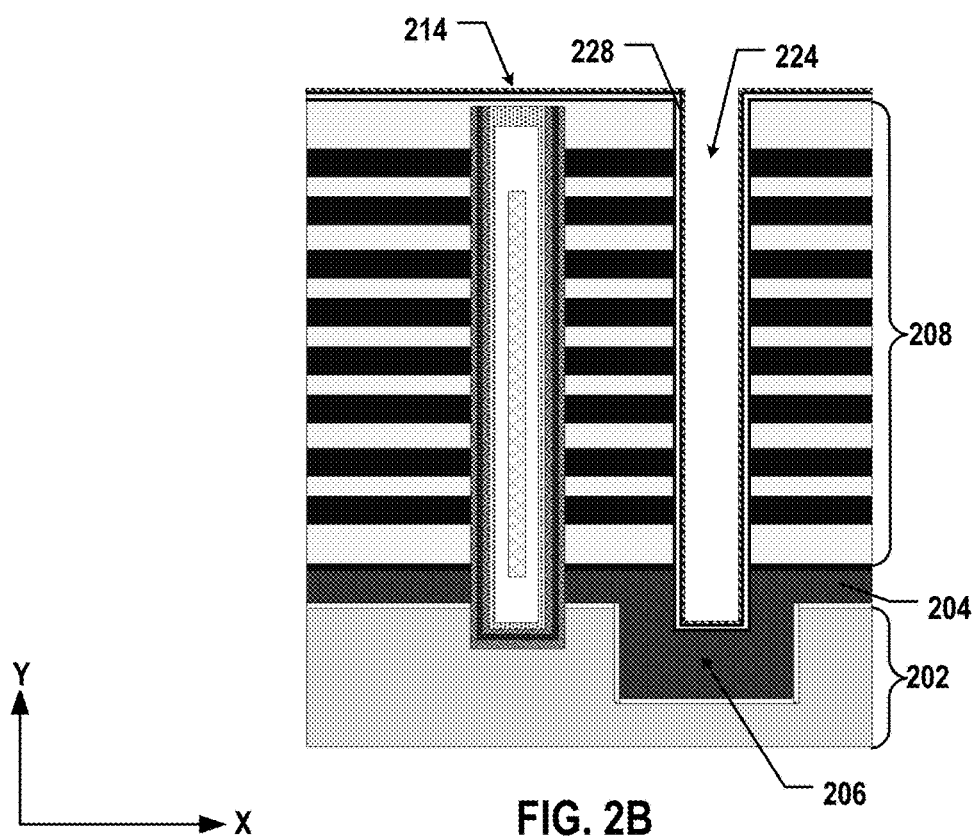
Figure 3:
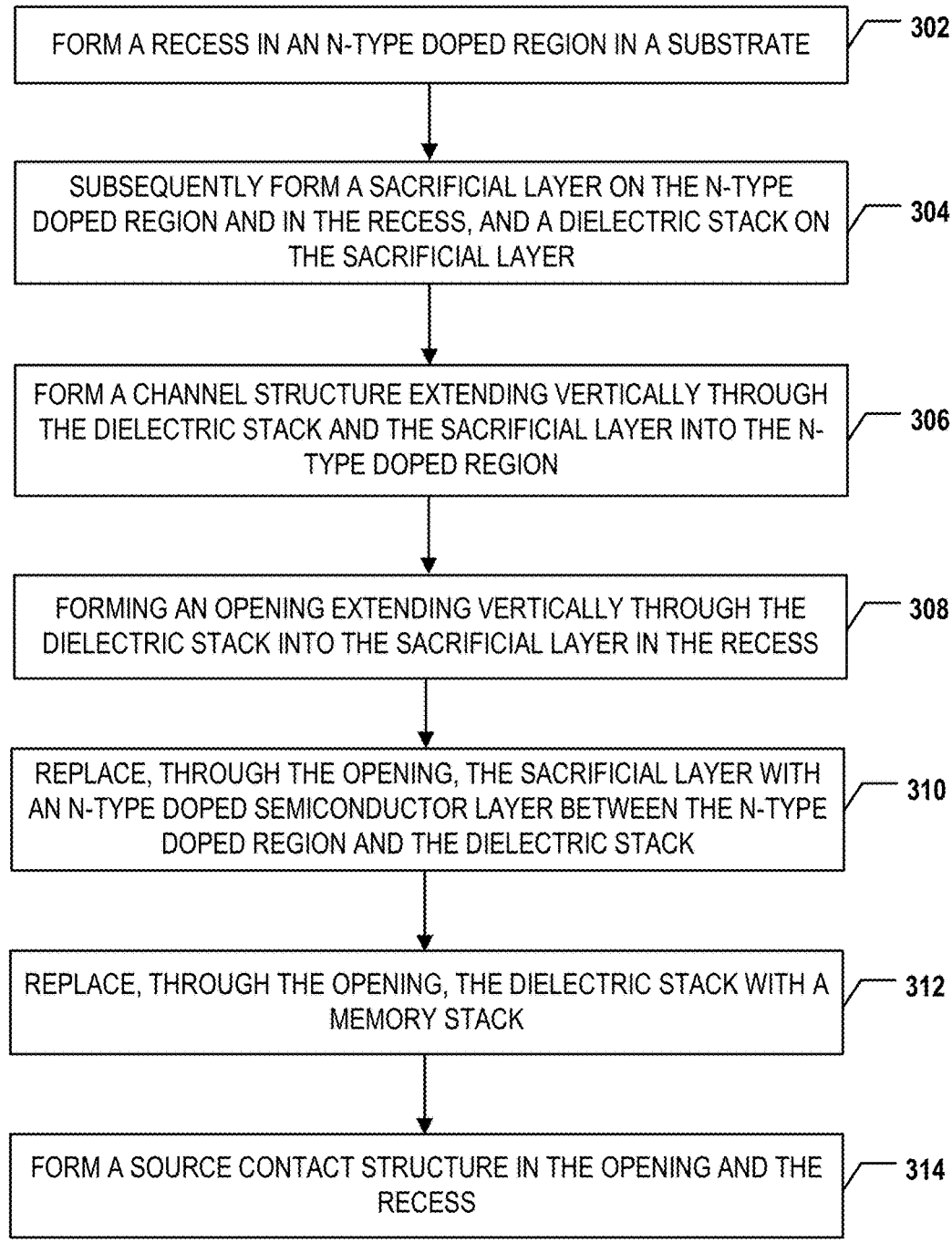
FIG. 3 illustrates a flowchart of a method for forming an exemplary 3D memory device, according to some embodiments of the present disclosure.

As illustrated in FIG. 2B, a slit 224 is an opening formed that extends vertically through dielectric stack 208 into sacrificial layer 204 in recess 206, which exposes part of sacrificial layer 204 in recess 206. In some embodiments, recess 206 is an enlarged recess with a lateral dimension in the x-direction greater than that of slit 224. Slit 224 can be first patterned using lithography process to be aligned with recess 206 laterally. The enlarged dimension of recess 206 can increase the overlay margin in the lateral direction. In some embodiments, fabrication processes for forming slit 224 further include wet etch and/or dry etch processes, such as DRIE. The existence of recess 206 filled with sacrificial layer 204 can increase the gouging margin of slit 224 in the vertical direction. That is, the etching of slit 224 no longer has to stop in sacrificial layer 204 above the top surface of the substrate and may stop in sacrificial layer 204 in recess 206. It is understood that the etching of slit 224 may stop at any depth in sacrificial layer 204. As a result, the gouging variation requirement among different slits 224 can be relaxed, thereby improving the production yield. In some embodiments, a spacer 228 is formed along the sidewall of slit 224 by depositing one or more dielectrics, such as high-k dielectrics, along the sidewall of slit 224.

Method 300 proceeds to operation 310, as illustrated in FIG. 3, in which the sacrificial layer is replaced, through the opening, with an N-type doped semiconductor layer between the N-type doped region and the dielectric stack. In some embodiments, to replace the sacrificial layer with the N-type doped semiconductor layer, the sacrificial layer is removed to form a cavity between the N-type doped region and the dielectric stack, part of the memory film is removed to expose part of the semiconductor channel along the sidewall of the channel hole, and N-type doped polysilicon is deposited into the cavity to form the N-type doped semiconductor layer. In some embodiments, to deposit the N-type doped polysilicon into the cavity, the polysilicon is in-situ doped with a uniform doping concentration profile to fill the cavity.

Figure 2C:
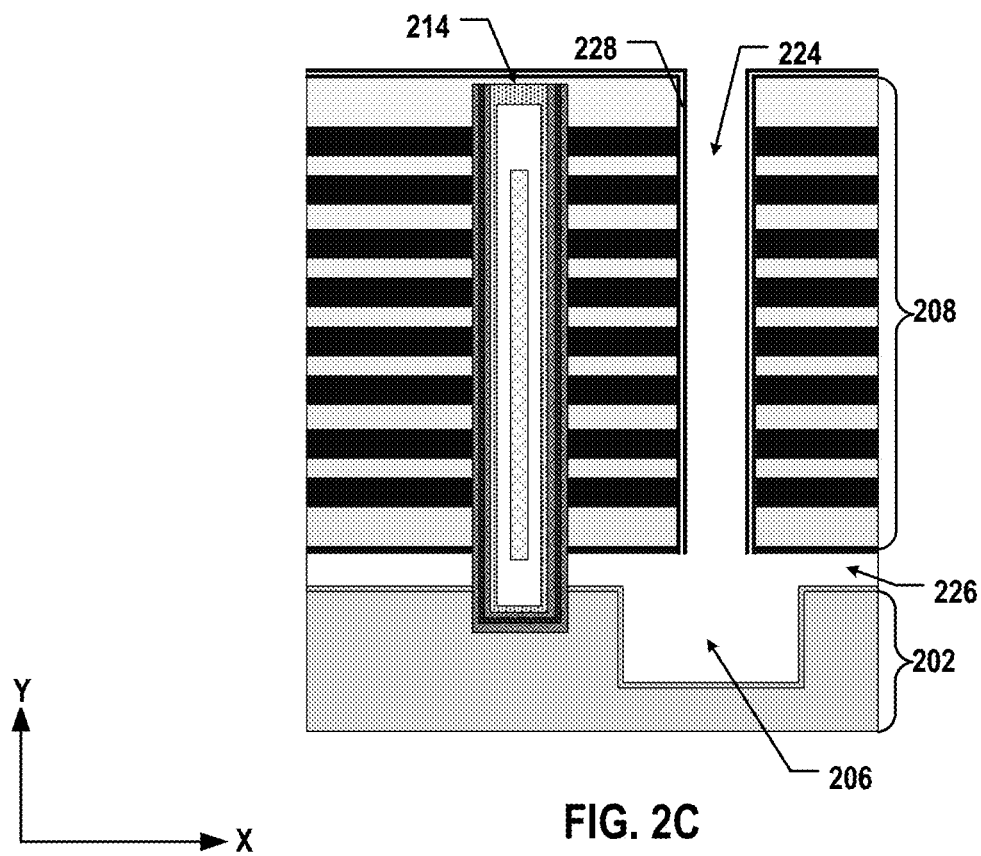

As illustrated in FIG. 2C, sacrificial layer 204 (shown in FIG. 2B) is removed by wet etching and/or dry etching to form a cavity 226 as well as to reopen recess 206. In some embodiments, sacrificial layer 204 includes polysilicon, spacer 228 includes a high-k dielectric, and sacrificial layer 204 is etched by applying tetramethylammonium hydroxide (TMAH) etchant through slit 224, which can be stopped by the high-k dielectric of spacer 228 as well as the pad oxide layer between sacrificial layer 204 and N-type doped region 202. That is, the removal of sacrificial layer 204 does not remove dielectric stack 208 and N-type doped region 202, according to some embodiments. Sacrificial layer 204 in recess 206 can be removed as well to reopen recess 206.

Figure 2D:
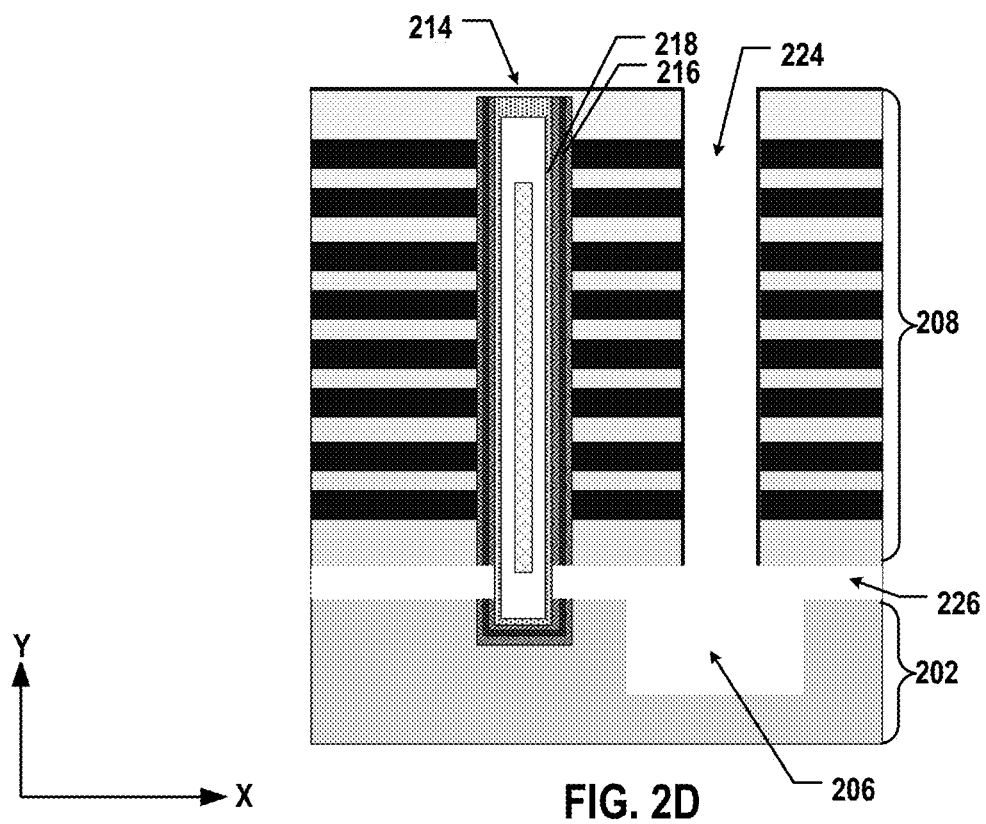

As illustrated in FIG. 2D, part of memory film 216 exposed in cavity 226 is removed to expose part of semiconductor channel 218 along the sidewall of channel structure 214. In some embodiments, parts of the blocking layer (e.g., including silicon oxide), storage layer (e.g., including silicon nitride), and tunneling layer (e.g., including silicon oxide) are etched by applying etchants through slit 224 and cavity 226, for example, phosphoric acid for etching silicon nitride and hydrofluoric acid for etching silicon oxide. The etching can be stopped by spacer 228 and semiconductor channel 218. That is, the removal of part of memory film 216 exposed in cavity 226 does not remove dielectric stack 208 (protected by spacer 228) and semiconductor channel 218 including polysilicon and capping layer 220 enclosed by semiconductor channel 218, according to some embodiments. In some embodiments, the pad oxide layer (including silicon oxide) is removed as well by the same etching process.

Figure 2E:
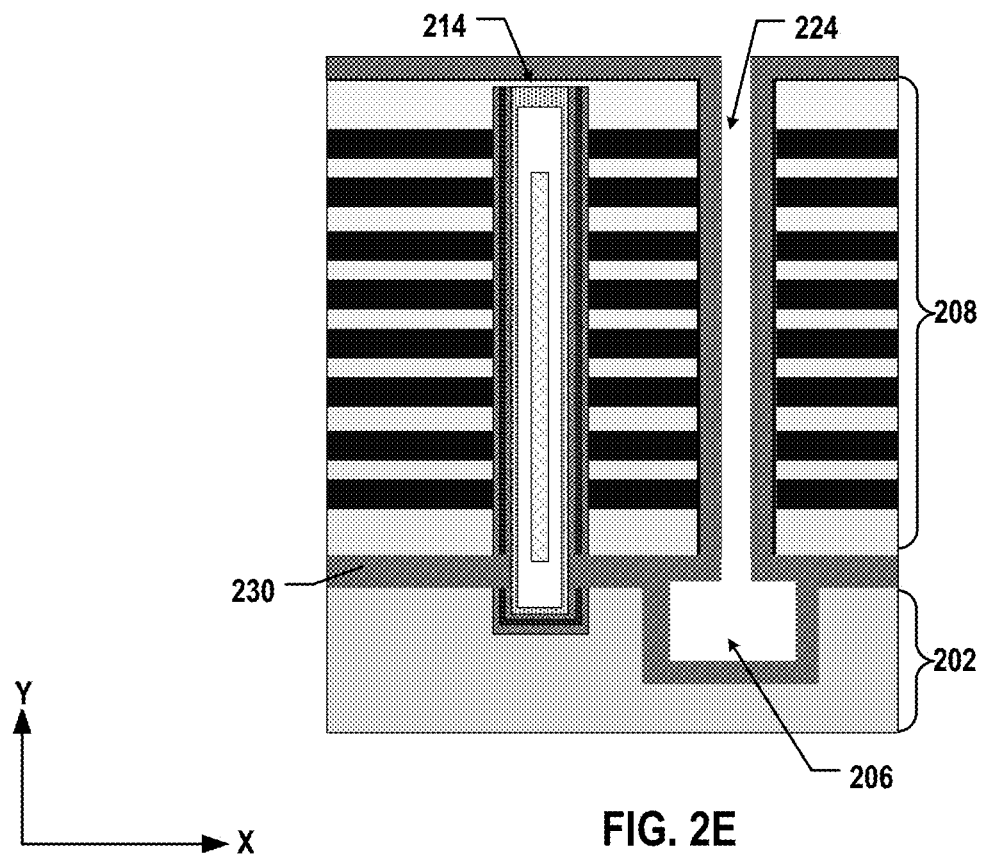

As illustrated in FIG. 2E, an N-type doped semiconductor layer 230 is formed between N-type doped region 202 and dielectric stack 208. In some embodiments, N-type doped semiconductor layer 230 is formed by depositing polysilicon into cavity 226 (shown in FIG. 2D) through slit 224 using one or more thin film deposition processes, such as CVD, PVD, ALD, or any combination thereof. In some embodiments, in-situ doping of N-type dopants, such as P, As, or Sb, is performed when depositing polysilicon to form N-type doped semiconductor layer 230. N-type doped semiconductor layer 230 can fill cavity 226, such that N-type doped semiconductor layer 230 is in contact with the exposed part of semiconductor channel 218 of channel structure 214. Since N-type doped semiconductor layer 230 is formed by deposition, as opposed to epitaxial growth from the exposed part of semiconductor channel 218, the surface conditions (e.g., cleanness) of semiconductor channel 218 do not affect the formation of N-type doped semiconductor layer 230, according to some embodiments. Moreover, N-type doped semiconductor layer 230 can be a single polysilicon layer with a uniform doping concentration profile between N-type doped region 202 and dielectric stack 208 formed by a single polysilicon deposition process with in-situ doping.

Figure 2F:
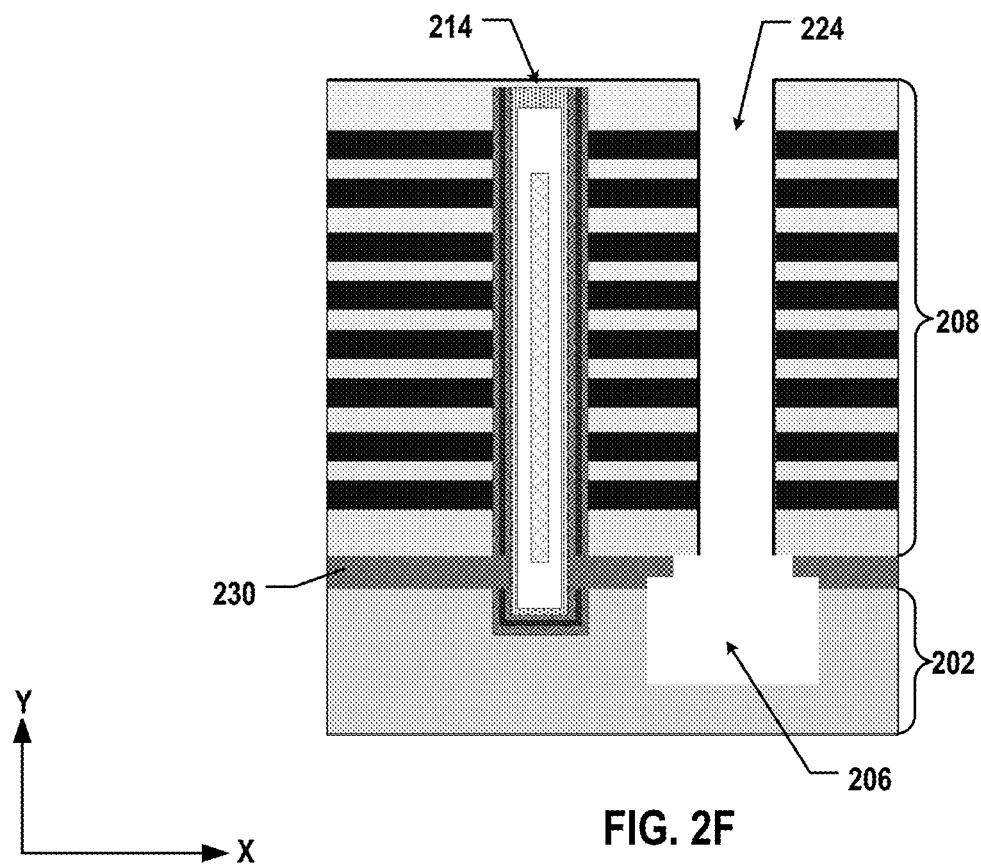

Method 300 proceeds to operation 312, as illustrated in FIG. 3, in which the dielectric stack is replaced, through the opening, with a memory stack. As illustrated in FIG. 2F, N-type doped semiconductor layer 230 formed in recess 206 (shown in FIG. 2E) and along the sidewall of slit 224 is removed using wet etching and/or dry etching to expose N-type doped region 202 in recess 206. The etching process can be controlled (e.g., by controlling the etching rate and/or time), such that N-type doped semiconductor layer 230 still remains between N-type doped region 202 and dielectric stack 208 and in contact with semiconductor channel 218 of channel structure 214. In some embodiments, the etching of N-type doped semiconductor layer 230 formed in recess 206 (e.g., etching of polysilicon deposited on the sidewall of recess 206) results in the remainder of recess 206 having a shape with nonuniform lateral dimension (e.g., in the x-direction) along the vertical direction. For example, as shown in FIG. 2F, the lateral dimension of a lower portion of the remainder of recess 206 surrounded by N-type doped region 202 may be greater than the lateral dimension of an upper portion of the remainder of recess 206 surrounded by N-type doped semiconductor layer 230.

Figure 2G:
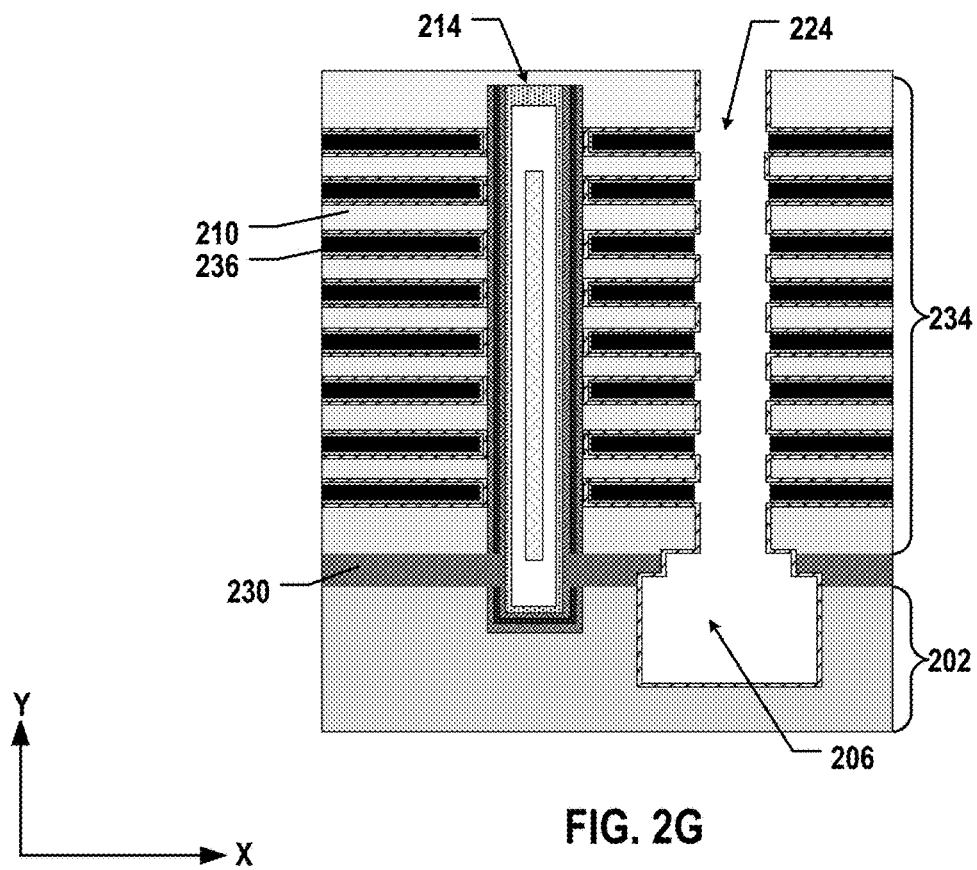

As illustrated in FIG. 2G, spacer 228 (as shown in FIG. 2C) covering the sidewalls of slit 224 is removed using wet etching and/or dry etching to expose stack sacrificial layers 212 (as shown in FIG. 2A) of dielectric stack 208. A memory stack 234 can be formed by a gate replacement process, i.e., replacing stack sacrificial layers 212 with stack conductive layers 236. Memory stack 234 thus can include interleaved stack conductive layers 236 and stack dielectric layers 210 on N-type doped semiconductor layer 230. In some embodiments, to form memory stack 234, stack sacrificial layers 212 are removed by applying etchants through slit 224 to form a plurality of lateral recesses. Stack conductive layers 236 then can be deposited into the lateral recesses by depositing one or more conductive materials using one or more thin film deposition processes, such as PVD, CVD, ALD, or any combinations thereof.

Method 300 proceeds to operation 314, as illustrated in FIG. 3, in which a source contact structure is formed in the opening and the recess. In some embodiments, to form the source contact structure, a spacer is formed along sidewalls of the opening and the recess, and a source contact is formed over the spacer and in contact with the N-type doped region. The source contact can include TiN.

Figure 2H:
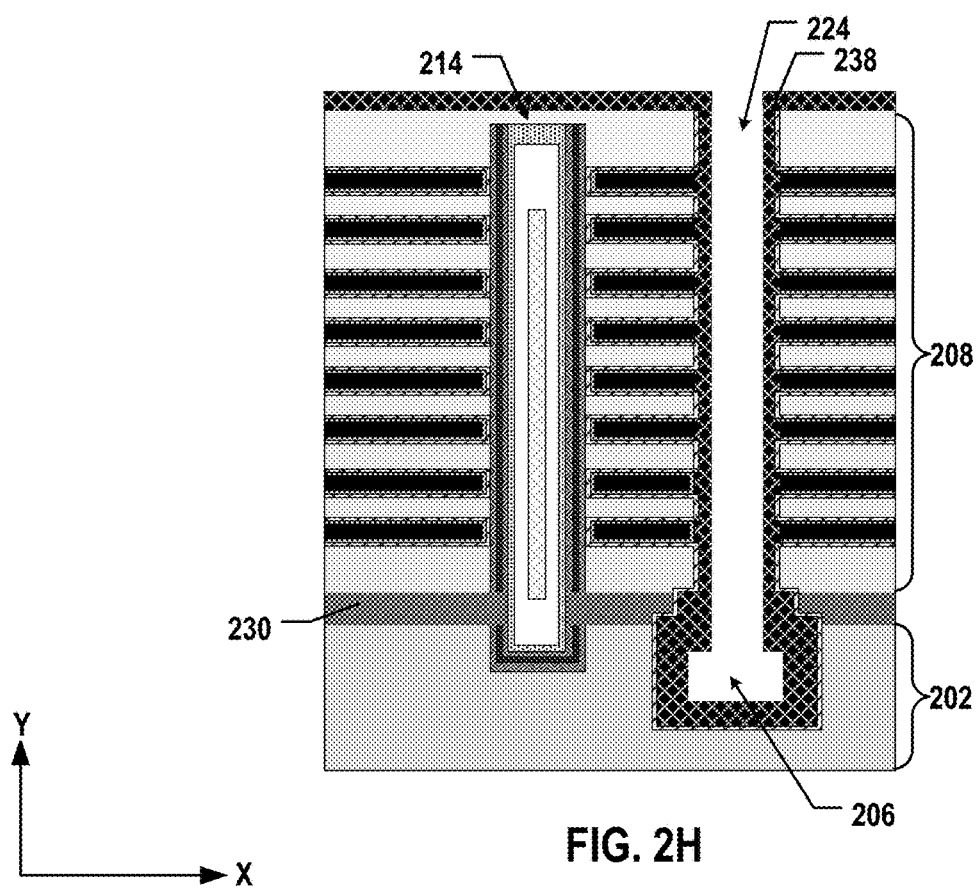

As illustrated in FIG. 2H, a spacer 238 including one or more dielectrics, such as silicon oxide, is formed along the sidewalls of slit 224 and recess 206 using one or more thin film deposition processes, such as PVD, CVD, ALD, or any combinations thereof. In some embodiments, spacer 238 formed at the bottom of recess 206 can be fully or partially removed to form an opening exposing N-type dope region 202 in recess 206, as illustrated in FIG. 2I.

Figure 2I:
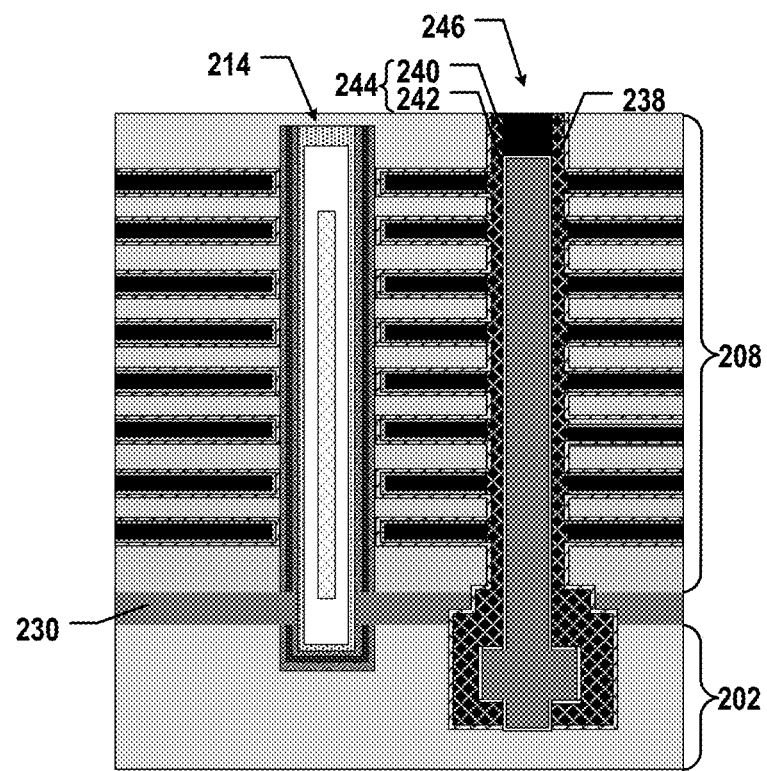
Figure 2I:
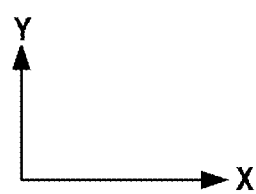

As illustrated in FIG. 2I, a source contact 244 is formed over spacer 238 to fill the the remainder of slit 224 and recess 206 (as shown in FIG. 2H) to be in contact with N-type doped region 202. In some embodiments, source contact 244 is formed by first forming an adhesion layer 242 over spacer 238 in slit 224 and recess 206 and in contact with N-type doped region 202 through the opening at the bottom of recess 206, for example, by depositing TiN using one or more thin film deposition processes, such as PVD, CVD, ALD, or any combinations thereof. Source contact 244 then can be formed by forming a conductive layer 240 over adhesion layer 242 in slit 224 and recess 206 to fully or partially fill slit 224 and recess 206, for example, by depositing polysilicon in recess 206 and the lower portion of slit 224 and depositing a metal (e.g., W) in the upper portion of slit 224 using one or more thin film deposition processes, such as PVD, CVD, ALD, electroplating, electroless plating, or any combinations thereof. A source contact structure 246 including spacer 238 and source contact 244 above and in contact with N-type doped region 202 is hereby formed, according to some embodiments.

According to one aspect of the present disclosure, a 3D memory device includes an N-type doped region of a substrate, an N-type doped semiconductor layer on the N-type doped region, a memory stack including interleaved conductive layers and dielectric layers on the N-type doped semiconductor layer, a channel structure extending vertically through the memory stack and the N-type doped semiconductor layer into the N-type doped region, and a source contact structure extending vertically through the memory stack and the N-type doped semiconductor layer into the N-type doped region. A first lateral dimension of a first portion of the source contact structure surrounded by the N-type doped region is greater than a second lateral dimension of a second portion of the source contact structure surrounded by the memory stack.

In some embodiments, the N-type doped semiconductor layer includes polysilicon.

In some embodiments, the N-type doped semiconductor layer is a single polysilicon layer with a uniform doping concentration profile.

In some embodiments, a doping concentration of the N-type doped semiconductor layer is between about $10^{17}$ $cm^{-3}$ and about $10^{21}$ $cm^{-3}$.

In some embodiments, the substrate is an N-type silicon substrate.

In some embodiments, the substrate is a P-type silicon substrate, and the N-type doped region is an N-well.

In some embodiments, the channel structure includes a memory film and a semiconductor channel, and part of the semiconductor channel along the sidewall of the channel structure is in contact with the N-type doped semiconductor layer.

In some embodiments, the 3D memory device is configured to generate GIDL-assisted body biasing when performing an erase operation.

In some embodiments, the source contact structure includes a source contact and a spacer each extending vertically through the memory stack and the N-type doped semiconductor layer into the N-type doped region.

In some embodiments, the source contact is in contact with the N-type doped region.

In some embodiments, the source contact includes TiN.

In some embodiments, the first lateral dimension of the first portion of the source contact structure is greater than a third lateral dimension of a third portion of the source contact structure surrounded by the N-type doped semiconductor layer.

In some embodiments, the third lateral dimension is greater than the second lateral dimension of the second portion of the source contact structure.

According to another aspect of the present disclosure, a 3D memory device includes an N-type doped region of a substrate, a memory stack including interleaved conductive layers and dielectric layers above the N-type doped region, a single N-type doped semiconductor layer between the N-type doped region and the memory stack and having a uniform doping concentration profile, and a channel structure extending vertically through the memory stack and the N-type doped semiconductor layer into the N-type doped region.

In some embodiments, the N-type doped semiconductor layer includes polysilicon.

In some embodiments, a doping concentration of the N-type doped semiconductor layer is between about $10^{17}$ $cm^{-3}$ and about $10^{21}$ $cm^{-3}$.

In some embodiments, the channel structure includes a memory film and a semiconductor channel, and part of the semiconductor channel along the sidewall of the channel structure is in contact with the N-type doped semiconductor layer.

In some embodiments, the 3D memory device is configured to generate GIDL-assisted body biasing when performing an erase operation.

In some embodiments, the 3D memory device further includes a source contact structure extending vertically through the memory stack and the N-type doped semiconductor layer into the N-type doped region. A first lateral dimension of a first portion of the source contact structure surrounded by the N-type doped region is greater than a second lateral dimension of a second portion of the source contact structure surrounded by the memory stack, according to some embodiments.

In some embodiments, the source contact structure includes a source contact and a spacer each extending vertically through the memory stack and the N-type doped semiconductor layer into the N-type doped region.

In some embodiments, the source contact is in contact with the N-type doped region.

In some embodiments, the source contact includes TiN.

In some embodiments, the first lateral dimension of the first portion of the source contact structure is greater than a third lateral dimension of a third portion of the source contact structure surrounded by the N-type doped semiconductor layer.

In some embodiments, the third lateral dimension is greater than the second lateral dimension of the second portion of the source contact structure.

In some embodiments, the substrate is an N-type silicon substrate.

In some embodiments, the substrate is a P-type silicon substrate, and the N-type doped region is an N-well.

According to still another aspect of the present disclosure, a method for forming a 3D memory device is provided. A recess is formed in an N-type doped region of a substrate. A sacrificial layer on the N-type doped region and in the recess, and a dielectric stack on the sacrificial layer are subsequently formed. A channel structure extending vertically through the dielectric stack and the sacrificial layer into the N-type doped region is formed. An opening extending vertically through the dielectric stack into the sacrificial layer in the recess is formed. The sacrificial layer is replaced, through the opening, with an N-type doped semiconductor layer between the N-type doped region and the dielectric stack. A source contact structure is formed in the opening and the recess.

In some embodiments, prior to forming the source contact structure, the dielectric stack is replaced, through the opening, with a memory stack, such that the channel structure extends vertically through the memory stack and the N-type doped semiconductor layer into the N-type doped region.

In some embodiments, a lateral dimension of the recess is greater than a lateral dimension of the opening.

In some embodiments, to form the channel structure, a channel hole extending vertically through the dielectric stack and the sacrificial layer into the N-type doped region is formed, and a memory film and a semiconductor channel are subsequently formed along a sidewall of the channel hole.

In some embodiments, to replace the sacrificial layer with the N-type doped semiconductor layer, the sacrificial layer is removed to form a cavity between the N-type doped region and the dielectric stack, part of the memory film is removed to expose part of the semiconductor channel along the sidewall of the channel hole, and N-type doped polysilicon is deposited into the cavity to form the N-type doped semiconductor layer.

In some embodiments, to deposit the N-type doped polysilicon into the cavity, the polysilicon is in-situ doped to fill the cavity with a uniform doping concentration profile.

In some embodiments, to form the source contact structure, a spacer is formed along sidewalls of the opening and the recess, and a source contact is formed over the spacer and in contact with the N-type doped region.

In some embodiments, the source contact includes TiN.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
an N-type doped region of a substrate;
an N-type doped semiconductor layer on the N-type doped region;
a memory stack comprising interleaved conductive layers and dielectric layers on the N-type doped semiconductor layer;
a channel structure extending vertically through the memory stack and the N-type doped semiconductor layer into the N-type doped region; and
a source contact structure extending vertically through the memory stack and the N-type doped semiconductor layer into the N-type doped region, wherein:
a first lateral dimension of a first portion of the source contact structure surrounded by the N-type doped region is greater than a second lateral dimension of a second portion of the source contact structure surrounded by the memory stack; and
a third lateral dimension of a third portion of the source contact structure surrounded by the N-type doped semiconductor layer is greater than the second lateral dimension of the second portion of the source contact structure.

2. The 3D memory device of claim 1, wherein the N-type doped semiconductor layer comprises polysilicon.

3. The 3D memory device of claim 2, wherein the N-type doped semiconductor layer is a single polysilicon layer with a uniform doping concentration profile.

4. The 3D memory device of claim 3, wherein a doping concentration of the N-type doped semiconductor layer is between about $10^{17}$ cm$^{-3}$ and about $10^{21}$ cm$^{-3}$.

5. The 3D memory device of claim 1, wherein the substrate is an N-type silicon substrate.

6. The 3D memory device of claim 1, wherein the substrate is a P-type silicon substrate, and the N-type doped region is an N-well.

7. The 3D memory device of claim 1, wherein the channel structure comprises a memory film and a semiconductor channel, and part of the semiconductor channel along a sidewall of the channel structure is in contact with the N-type doped semiconductor layer.

8. The 3D memory device of claim 1, wherein the 3D memory device is configured to generate gate-induced-drain-leakage (GIDL)-assisted body biasing when performing an erase operation.

9. The 3D memory device of claim 1, wherein the source contact structure comprises a source contact and a spacer each extending vertically through the memory stack and the N-type doped semiconductor layer into the N-type doped region.

10. The 3D memory device of claim 9, wherein the source contact is in contact with the N-type doped region.

11. The 3D memory device of claim 9, wherein the source contact comprises titanium nitride (TiN).

12. The 3D memory device of claim 1, wherein the first lateral dimension of the first portion of the source contact structure is greater than the third lateral dimension of the third portion of the source contact structure.

13. A three-dimensional (3D) memory device, comprising:
    an N-type doped region of a substrate, the N-type doped region being in direct contact with an end of a source contact structure;
    a memory stack comprising interleaved conductive layers and dielectric layers above the N-type doped region;
    a single N-type doped semiconductor layer between the N-type doped region and the memory stack and having a uniform doping concentration profile; and
    a channel structure extending vertically through the memory stack and the N-type doped semiconductor layer into the N-type doped region.

14. The 3D memory device of claim 13, wherein:
    the uniform doping concentration profile of the single N-type doped semiconductor layer is distributed vertically between the memory stack and the N-type doped region.

15. A method for forming a three-dimensional (3D) memory device, comprising:
    forming a recess in an N-type doped region of a substrate, subsequently forming a sacrificial layer on the N-type doped region and in the recess, and a dielectric stack on the sacrificial layer;
    forming a channel structure extending vertically through the dielectric stack and the sacrificial layer into the N-type doped region;
    forming an opening extending vertically through the dielectric stack into the sacrificial layer in the recess;
    replacing, through the opening, the sacrificial layer with an N-type doped semiconductor layer between the N-type doped region and the dielectric stack; and
    forming a source contact structure in the opening and the recess.

16. The method of claim 15, further comprising prior to forming the source contact structure, replacing, through the opening, the dielectric stack with a memory stack, such that the channel structure extends vertically through the memory stack and the N-type doped semiconductor layer into the N-type doped region.

17. The method of claim 15, wherein forming the channel structure comprises:
    forming a channel hole extending vertically through the dielectric stack and the sacrificial layer into the N-type doped region; and
    subsequently forming a memory film and a semiconductor channel along a sidewall of the channel hole.

18. The method of claim 17, wherein replacing the sacrificial layer with the N-type doped semiconductor layer comprises:
    removing the sacrificial layer to form a cavity between the N-type doped region and the dielectric stack;
    removing part of the memory film to expose part of the semiconductor channel along the sidewall of the channel hole; and
    depositing N-type doped polysilicon into the cavity to form the N-type doped semiconductor layer.

19. The method of claim 18, wherein depositing the N-type doped polysilicon into the cavity comprises in-situ doping the polysilicon to fill the cavity with a uniform doping concentration profile.

20. The method of claim 15, wherein forming the source contact structure comprises:
    forming a spacer along sidewalls of the opening and the recess; and
    forming a source contact over the spacer and in contact with the N-type doped region.

* * * * *